United States Patent
Simony

(10) Patent No.: US 9,473,160 B2
(45) Date of Patent: Oct. 18, 2016

(54) METHOD AND DEVICE FOR ANALOG/DIGITAL CONVERSION OF AN ANALOG SIGNAL

(71) Applicant: STMICROELECTRONICS (GRENOBLE 2) SAS, Grenoble (FR)

(72) Inventor: Laurent Simony, Grenoble (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 0 days.

(21) Appl. No.: 14/835,980

(22) Filed: Aug. 26, 2015

(65) Prior Publication Data
US 2016/0134297 A1      May 12, 2016

(30) Foreign Application Priority Data

Nov. 7, 2014    (FR) .................................. 14 60781

(51) Int. Cl.
*H03M 1/56*    (2006.01)
*H03M 1/20*    (2006.01)
(Continued)

(52) U.S. Cl.
CPC .......... *H03M 1/20* (2013.01); *H01L 27/14643* (2013.01); *H03M 1/002* (2013.01); *H03M 1/0604* (2013.01); *H03M 1/188* (2013.01); *H03M 1/36* (2013.01); *H03M 1/56* (2013.01)

(58) Field of Classification Search
CPC .......... H03M 1/20; H03M 1/60; H03M 1/12; H03M 1/1225; H03M 1/56; H03M 1/36; H03M 1/002; H03M 1/1295; H03M 1/123; H03M 1/164; H03M 1/0604; H03M 1/188
USPC ................................................. 341/130–170
See application file for complete search history.

(56) References Cited

U.S. PATENT DOCUMENTS

| 5,250,948 A | 10/1993 | Berstein et al. |
| 7,982,652 B2 | 7/2011 | Simony et al. |

(Continued)

FOREIGN PATENT DOCUMENTS

| EP | 2456075 A1 | 5/2012 |
| EP | 2552105 A2 | 1/2013 |

OTHER PUBLICATIONS

G.G. Storm et al., Continuous Time Column Parallel Readout for CMOS Image Sensor, 2007 International Image Sensor Workshop, Jun. 7, 2007-Jun. 10, 2007, pp. 58-61.

(Continued)

*Primary Examiner* — Lam T Mai
(74) *Attorney, Agent, or Firm* — Allen, Dyer, Doppelt, Milbrath & Gilchrist, P.A.

(57) ABSTRACT

A method includes a first analog/digital conversion of an analog signal over m bits, with m less than n, associated with a first full-scale value, and a second analog/digital conversion of the analog signal over m bits associated with a second full-scale value $2^{n-m}$ times bigger than the first. The two analog/digital conversions are carried out simultaneously and respectively delivering a first intermediate digital word of m bits and a second intermediate digital word of m bits. The method also includes a digital post-processing carried out after the two analog/digital conversions and generating an n-bit digital word starting from at least one of the two intermediate digital words extended to n bits and from at least one threshold digital indication representative of at least one threshold lower than or equal to the first full-scale value.

20 Claims, 6 Drawing Sheets

(51) Int. Cl.
*H03M 1/00* (2006.01)
*H03M 1/06* (2006.01)
*H03M 1/36* (2006.01)
*H01L 27/146* (2006.01)
*H03M 1/18* (2006.01)

(56) References Cited

U.S. PATENT DOCUMENTS

2009/0295959 A1* 12/2009 Shoho ................ H04N 5/35554
 348/294
2011/0063148 A1* 3/2011 Kolze ................. H03M 1/1033
 341/118
2012/0007760 A1* 1/2012 Knudsen ................. H03M 3/43
 341/143
2014/0218577 A1* 8/2014 Kanemitsu ......... H04N 5/35563
 348/302
2014/0313385 A1 10/2014 Sato et al.
2015/0189213 A1* 7/2015 Tanaka ................... H04N 5/369
 250/208.1

OTHER PUBLICATIONS

Milch, High-Resolution Digitization of Photographic Images with an Area Charge-Coupled Device (CCD) Imager, Proceedings of SPIE, vol. 0697, Dec. 10, 1986, pp. 96-104.

* cited by examiner

METHOD AND DEVICE FOR ANALOG/DIGITAL CONVERSION OF AN ANALOG SIGNAL

FIELD

Various embodiments of the invention relate to the analog/digital conversion of analog signals, in particular those coming from image sensors, and notably analog/digital conversion using ramp-type analog/digital converters.

BACKGROUND

Analog/digital converters are notably used in image sensors to convert an analog signal representative of the illumination sensed by a photodiode of a pixel into a digital word for storing in memory and processing in digital circuits. In the majority of image sensors fabricated using CMOS technology, an analog/digital converter is generally assigned to each column of pixels of the sensor and the conversions are carried out simultaneously for the pixels of the same row.

One type of analog/digital converter typically used is a ramp-type analog/digital converter, also known by those skilled in the art under the acronym SS-ADC ("Single-Slope Analog to Digital Converter"). The structure and the operation of such a ramp-type analog/digital converter is well known to those skilled in the art and the latter will, for example, be able to refer as required to the European Patent application published under the number EP 2456075 and/or to the article by G. G. Storm et al.: "Continuous Time Column Parallel Readout for CMOS Image Sensor", 2007 International Image Sensor Workshop, Jun. 7, 2007-Jun. 10, 2007, pages 58-61.

Such ramp-type analog/digital converters are notably used owing to their compactness, to their low power consumption and to their low noise.

Currently, there is a requirement for high-speed image sensors having a large matrix of pixels, high data rates and capable of multiple exposures.

In a corresponding manner, there is also a growing desire to increase the resolution of analog/digital converters going, for example, from 10 to 12 bits.

However, this increase in resolution comes with limitations notably when it is desired to use ramp-type analog/digital converters. This is because an increase in resolution of 2 bits leads to a duration of the ramp multiplied by 4, which may increase by the same factor the period of time for carrying out the analog/digital conversion.

SUMMARY

According to one embodiment and its implementation, the resolution of an analog/digital converter is increased without, however, increasing its complexity or processing time. In particular, relying on the advantages of ramp-type converters while at the same time carrying out an analog/digital conversion over 12 bits in the same time as an analog/digital conversion over 10 bits.

According to one aspect, a method is provided for the analog/digital conversion of an analog signal into an n-bit digital word (n=12 for example); the analog signal can be representative of the illumination sensed by a photodiode.

The method according to this aspect may comprise a first analog/digital conversion of the analog signal over m bits, with m less than n (m=10 for example), associated with a first full-scale value, and a second analog/digital conversion of the analog signal/digital over m bits associated with a second full-scale value higher than the first by a ratio k, which is a gain ratio between the two analog/digital converters, having a value equal or substantially equal to $2^{n-m}$. Thus, if n-m is equal to 2, the theoretical gain ratio between the two analog/digital converters is equal to 4, but in practice it is generally close to 4. The two analog/digital conversions may be carried out simultaneously and respectively to deliver a first intermediate m-bit digital word and a second intermediate m-bit digital word.

The method may also include digital post-processing, which is carried out after the two analog/digital conversions, for generating the n-bit digital word starting from at least one of the two intermediate digital words extended to n bits and from at least one threshold digital indication that is representative of at least one threshold lower than or equal to the first full-scale value.

Thus, according to this aspect, the two analog/digital conversions may be carried out synchronously in the analog domain, which does not require any additional time. Furthermore, the generation of the n-bit digital word starting from at least one of the intermediate digital words resulting from two analog/digital conversions is carried out in the digital domain. This does not, therefore, impose any limitations in terms of analog processing speed.

Furthermore, the "overall" analog/digital conversion according to this aspect is a conversion carried out directly and in a unidirectional manner, with the digital post-processing carried out at the end of the chain and not requiring any type of feedback process.

Finally, each analog/digital converter may operate independently with its own reset and consequently under its nominal operating conditions.

Several types of post-processing are possible. Thus, for example in a simple version, if the first intermediate digital word is less than the threshold digital indication, the method may comprise a selection of the first intermediate digital word and an extension to n bits of this first intermediate digital word selected by adding n-m most-significant zero bits. In the opposite case, the method may comprise a selection of the second intermediate digital word and an extension to n bits of this second intermediate digital word by adding n-m least-significant bits, for example zeros or obtained in a random manner. The n-bit digital word generated by this method of analog/digital conversion is then the intermediate digital word selected and extended to n bits.

As a variant, it may be possible for the digital post-processing to define several threshold digital indications, potentially with settable parameters that are respectively representative of several thresholds all less than the first full-scale value, for example two threshold digital indications then defining three regions.

In the first region, the first intermediate digital word is selected that is extended to n bits by the addition of n-m most-significant zero bits in order to form the n-bit digital word. In the third region, the n-bit digital word is the second intermediate digital word extended over n bits by multiplication by the gain ratio. In the second region, which is situated between the first region and the third region, a weighted average is carried out between the first intermediate digital word extended to n bits by the addition of n-m most-significant zero bits and the second intermediate digital word extended to n bits by multiplying by the gain ratio. The weighting factors may vary progressively between the two threshold digital indications.

These two examples of post-processing are not limiting and do not exclude the use of other types of digital post-processing. It may be possible to use any type of analog/ digital converter. When ramp-type analog/digital converters are used, several embodiments may be possible.

Thus, according to one embodiment, the first analog/ digital conversion is carried out in a first ramp-type converter and may comprise a generation of a first voltage ramp delivered to an input of the first converter by a first capacitive connection, whereas the second analog/digital conversion is carried out in a second ramp-type converter and may comprise a generation of a second voltage ramp delivered to an input of the second converter by a second capacitive connection. According to this embodiment, the first voltage ramp then has a slope lower than the slope of the second voltage ramp by the gain ratio, whereas the capacitive values of the two connections are identical or substantially identical.

According to another possible embodiment, which may be preferable in some respects, only one ramp is generated. More precisely, the first analog/digital conversion is carried out in a first ramp-type converter and may comprise a generation of a voltage ramp delivered to an input of the first converter by a first capacitive connection. The second analog conversion is carried out in a second ramp-type converter and may comprise the generation of the voltage ramp delivered to an input of the second converter by a second capacitive connection. The capacitive value of the second connection is then lower than the capacitive value of the first connection by the gain ratio.

According to another aspect, an analog/digital conversion device is provided that may comprise a signal input for receiving an analog signal, a processor configured for carrying out an analog/digital conversion of the analog signal into an n-bit digital word. According to a general feature of this other aspect, the processor may comprise a first analog/ digital converter having a first input connected to the signal input and configured for carrying out a first analog/digital conversion of the analog signal over m bits, with m less than n, associated with a first full-scale value and delivering a first intermediate m-bit digital word. A second analog/digital converter may have a second input connected to the signal input and configured for carrying out a second analog/digital conversion of the analog signal over m bits associated with a second full-scale value higher than the first by a gain ratio having a value equal or substantially equal to $2^{n-m}$, and delivering a second intermediate m-bit digital word. A controller may be configured to make the two converters operate simultaneously in such a manner that the two analog/digital conversions are carried out simultaneously, and a post-processing module connected to the outputs of the two analog/digital converters is configured for carrying out a digital post-processing generating the n-bit digital word starting from at least one of the two intermediate digital words extended to n bits and from at least one threshold digital indication representative of at least one threshold lower than or equal to the first full-scale value.

According to one embodiment, each analog/digital converter is a ramp-type converter and the controller may comprise a first generator configured for generating a first voltage ramp and a second generator configured for generating a second voltage ramp, the first voltage ramp having a slope lower than the slope of the second voltage ramp by the gain ratio, a first capacitive connection connecting the output of the first generator to the first input of the first analog/digital converter, a second capacitive connection connecting the output of the second generator to the second input of the second analog/digital converter, the capacitive values of the two connections being identical or substantially identical.

According to another embodiment, each analog/digital converter comprises a ramp-type converter, the controller may comprise a generator configured for generating a voltage ramp, a first capacitive connection connecting the output of the generator to the first input of the first analog/digital converter, a second capacitive connection connecting the output of the generator to the second input of the second analog/digital converter, and the capacitive value of the second connection being lower than the capacitive value of the first connection by the gain ratio.

According to another aspect, an image sensor may be provided comprising at least one pixel configured for delivering an analog signal representative of the illumination sensed by the pixel and an analog/digital conversion device such as defined hereinbefore, whose signal input is intended to receive the analog signal.

According to one embodiment, the image sensor comprises a matrix of pixels organized in rows and in columns, each pixel having a width measured in the direction of the rows and defining a column width and, per column, and an analog/digital conversion device such as defined hereinbefore whose signal input is designed to receive the signal from a pixel selected from the column. The conversion device may be situated outside of the matrix of pixels at least in part in at least one extension and within the width of the corresponding column. Depending on the size of the pixels, two embodiments may be possible.

Thus, for wide pixels, the two analog/digital converters for each digital row are advantageously placed side by side at the end of the corresponding column.

On the other hand, for smaller pixels, the two analog/ digital converters are respectively placed at the two ends of the corresponding column.

BRIEF DESCRIPTION OF THE DRAWINGS

Other advantages and features of the invention will become apparent upon examining the detailed description of non-limiting embodiments and their implementations, and the appended drawings in which.

DETAILED DESCRIPTION

The present invention will now be described more particularly in relation to one example of application to image sensors. The invention is however more generally applicable to any analog/digital conversion requiring an increase in the resolution in order to go, for example, from 10 to 12 bits, without increasing the conversion time, and in which noise is present that is analogous to noise of the "shot noise" type or else requiring a higher resolution (for example 12 bits) in the first part of its input range.

Figure 1:
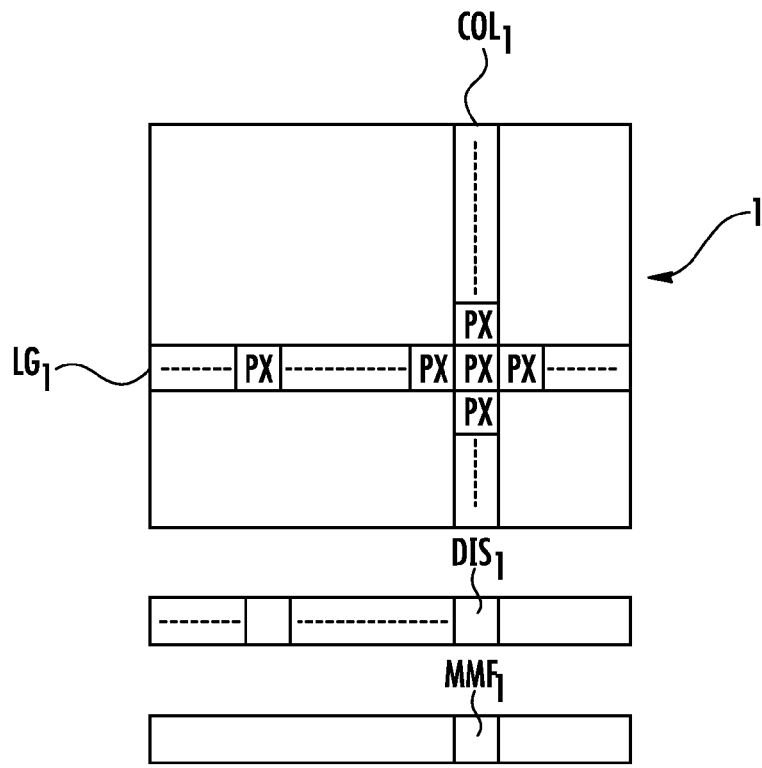
FIGS. 1 and 3 to 9 illustrate schematically various embodiments of the invention and their implementation.

FIG. 1 shows schematically an image sensor comprising a matrix 1 of pixels PX organized in rows $LG_i$ and in columns $COL_i$. In the extension of each column $COL_i$ an analog/digital conversion device $DIS_i$ is disposed for receiving an analog signal representative of the illumination sensed by a photodiode of the pixel selected in the column COL$_i$ and delivering a corresponding digital word intended to be stored, for example, in a memory MMF$_i$ with a view to its later use.

Figure 2:
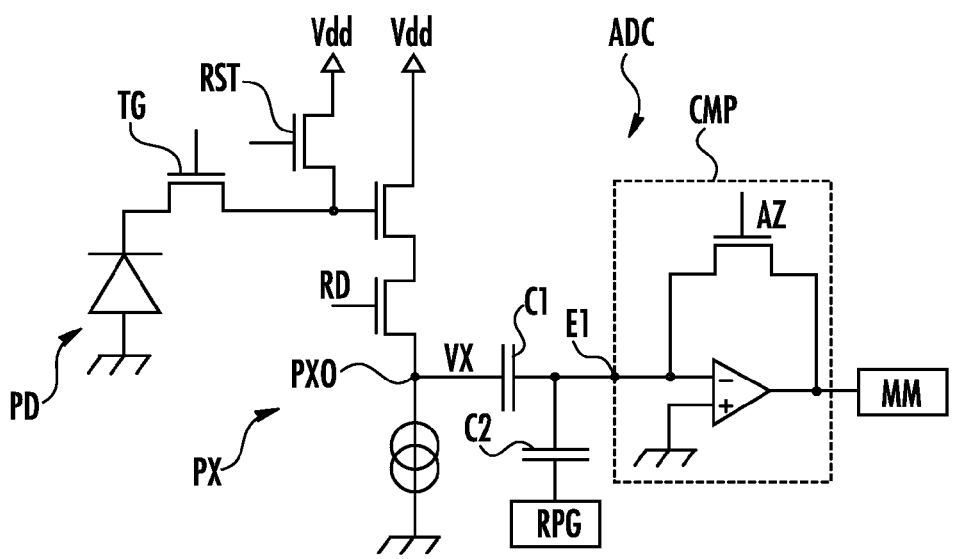
FIG. 2 illustrates schematically an analog/digital converter of the prior art.

Each pixel PX can be, but is not limited to, of the type with four transistors such as that illustrated in FIG. 2 which shows schematically a ramp-type analog/digital converter ADC with a conventional structure.

The analog signal VX, or voltage variation, delivered by the pixel PX and representative of the illumination sensed by the photodiode PD, is delivered to the terminal PXO of the control logic for the pixel PX. The control transistors are represented in the conventional manner by reset RST, read RD and transfer TG signals.

The analog/digital converter ADC, which is going to convert the analog signal VX into a digital word in order to store it in the memory MM, is here a ramp-type converter with a structure and operation well known to those skilled in the art. A few of their features will be briefly recalled here, those skilled in the art being able to refer at their convenience to the European Patent application number EP 2456075 and/or to the aforementioned article by G. G. Storm et al.

The ADC converter comprises a comparator stage CMP that may comprise one or more amplifiers (here only one amplifier controlled by a signal AZ is shown). The comparator stage CMP has an input E1 connected to one of the inputs of the amplifier and this input E1 is connected to the terminal PXO by a capacitor C1. The converter ADP also comprises a generator RPG designed to generate a voltage ramp on the input E1 by a capacitor C2.

In practice, this ramp can be generated by a counter and of a digital/analog converter. The comparator stage CMP stores the instantaneous value of the counter in memory when the ramp voltage reaches the voltage VX to be converted. The stored value then represents the result over m bits which is then stored in the memory MM.

Figure 3:
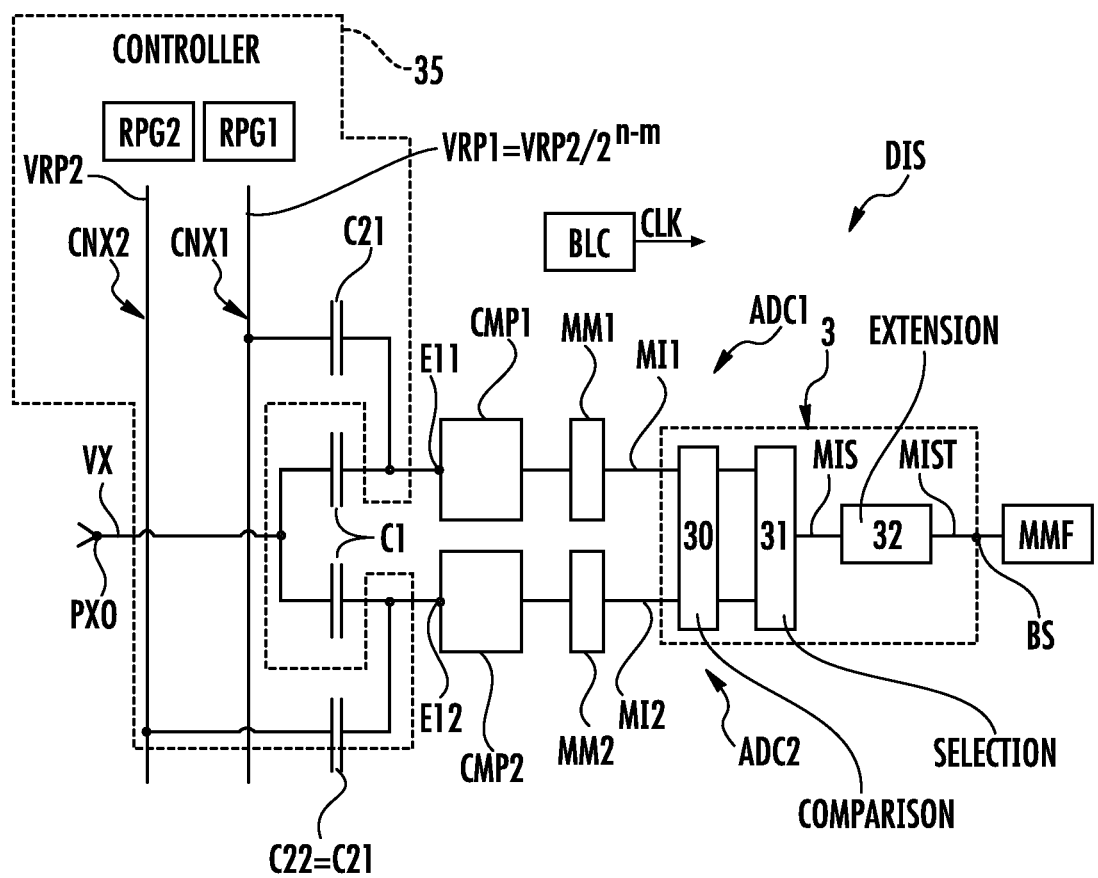

Reference is now more particularly made to FIG. 3 in order to describe one embodiment of an analog/digital conversion device DIS according to the invention. In this embodiment, the device DIS comprises two ramp-type analog/digital converters ADC1 and ADC2. Each analog/digital converter is designed to carry out an analog/digital conversion of the analog signal VX over m bits and the device DIS will supply, on its output terminal BS, a digital word corresponding to the analog/digital conversion of the signal VX over n bits, with n greater than m. In the rest of the description, it will be assumed that n is equal to 12, whereas m is equal to 10.

The first converter ADC1 comprises a comparator stage CMP1 whose input E11 is, on the one hand, connected to the terminal PXO by a capacitor C1 in order to receive the analog signal VX and, on the other hand, to the output of a first ramp generator RPG1 by a first capacitive connection CNX1. The capacitive value of this first connection means CNX1 is represented by the capacitor C21.

The first analog/digital conversion of the signal VX carried out in the first converter ADC1 results in a first intermediate word MI1 over m bits which is stored in the memory MM1.

The second converter ADC2 comprises a comparator stage CMP2 whose input E12 is connected, on the one had, to the terminal PXO by another capacitor C1 in order to also receive the analog signal VX and, on the other hand, to the output of a second ramp generator RPG2 by a second capacitive connection CNX2.

The capacitive value of this second connection CNX2 is represented by the capacitor C22 which, in this embodiment, has a capacitive value identical or substantially identical to that of the capacitor C21.

In practice, the connections CNX1 and CNX2 may be formed by metallization structures and the capacitors C21 and C22 are then metal-metal capacitors formed between metallization lines for example. The capacitive connections CNX1 and CNX2 along with the voltage ramps RPG1 and RPG2 define the controller 35 in this embodiment.

The second analog/digital converter ADC2 also carries out an analog/digital conversion of the signal VX over m bits.

These two analog/digital conversions of the signal VX are effectively carried out simultaneously. In practice, this is obtained by a synchronous operation of the two converters ADC1 and ADC2 notably using the same clock signals CLK produced by a control block BLC.

The first converter ADC1 has a first full-scale value, whereas the second converter ADC2 has a second full-scale value (denoted by Vmax) which is $2^{n-m}$ times bigger than the first full-scale value. In the example described, the second full-scale value is four times (n-m=2) bigger than the first full-scale value hence equal to Vmax/4.

In order to obtain this factor $2^{n-m}$ between the full-scale values, the first ramp generator RPG1 generates a first maximum voltage ramp VRP1 and the second ramp generator RPG2 generates a second voltage ramp of maximum amplitude VRP2, with the first voltage ramp VRP1 being $2^{n-m}$ times smaller than the second voltage ramp VRP2.

Aside from these two analog/digital converters ADC1 and ADC2, the device DIS comprises a digital post-processing module 3 comprising, in this variant embodiment, means of comparison 30, means of selection 31 and means of extension 32.

These various means, whose function will be considered in more detail hereinafter, may for example be formed by software within a micro-controller and/or by logic circuits.

This variant embodiment of the digital post-processing module and implementation of the corresponding digital post-processing, which will now be described with reference more particularly to FIGS. 3 to 9, is only one possible non-limiting example of post-processing.

Figure 4:
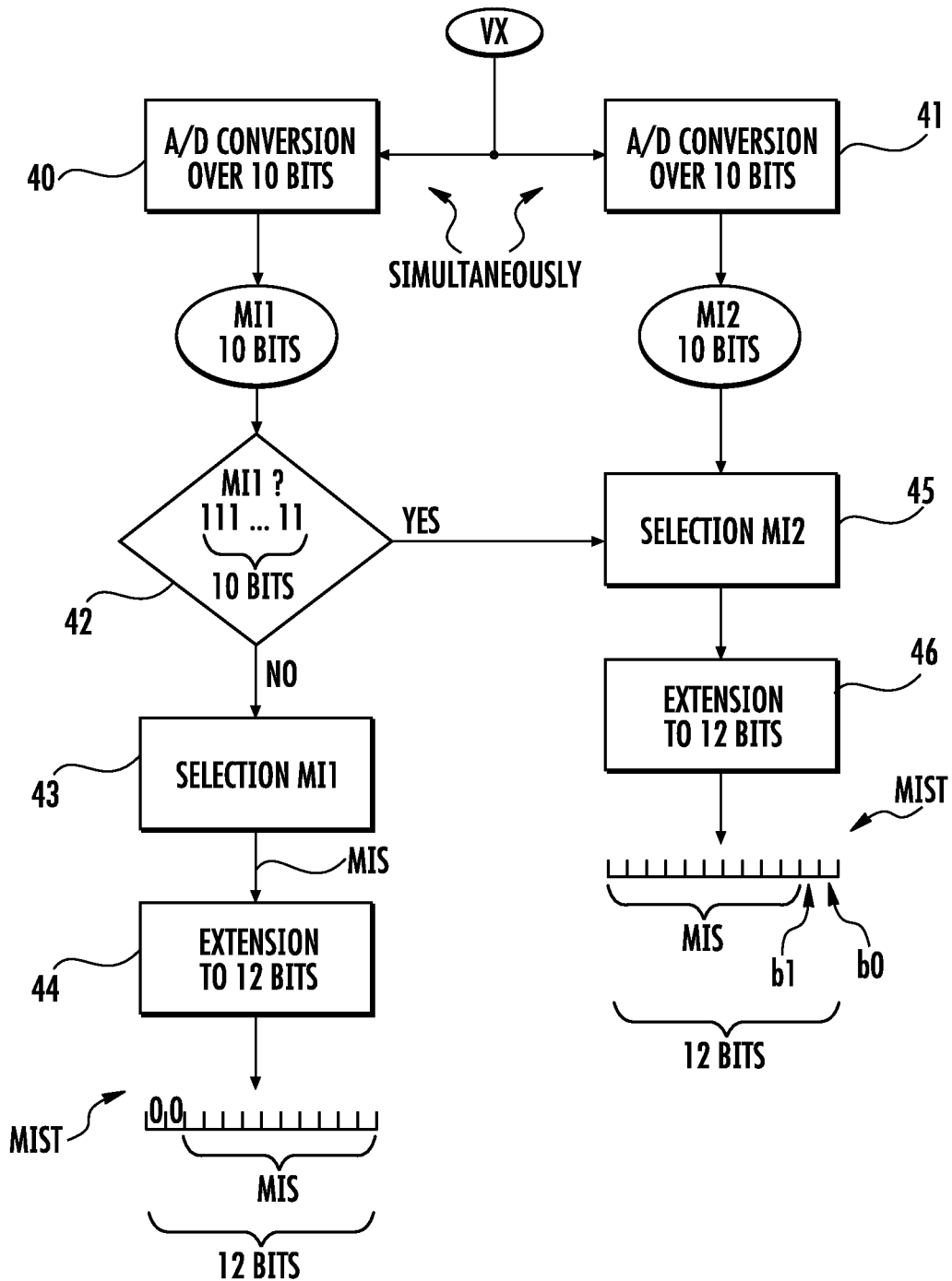

Reference will now more particularly be made to FIG. 4 in order to illustrate a first embodiment of this variant.

The two analog/digital conversions over 10 bits (40 and 41) of the analog signal VX, respectively carried out simultaneously in the two converters ADC1 and ADC2, respectively supply a first intermediate word MI1 over 10 bits and a second intermediate word MI2 over 10 bits, these two words being stored in the memories MM1 and MM2.

The means of comparison 30 will carry out a comparison in the digital domain representative of a comparison of the level of the analog signal VX with the first full-scale value Vmax/4. In practice, as illustrated in FIG. 4, this comparison may be carried out by comparing the logic value of the first intermediate word MI1 (step 42) with a threshold digital indication representative of the first full-scale value. This threshold digital indication is here a digital word of 10 bits having all these bits at 1.

More precisely, if this first intermediate word MI1 only comprises ones, then this means that the analog signal VX is at a level higher than or equal to the first full-scale value. In the opposite case, this means that the level of the signal VX is lower than the first full-scale value Vmax/4. In the latter case, the means of selection 31 will select (step 43) the first intermediate means MI1. Then, this selected word MIS will be extended (step 44) at 12 bits by the means of extension 32.

More precisely, in this case, the extension includes in adding two most-significant bits having with zero values so as to form an extended word MIST over 12 bits. This word MIST is then delivered to the output terminal BS of the device DIS in order to be stored in the memory MMF. This word MIST is the result of the analog/digital conversion over 12 bits of the analog signal VX.

In the case where, in the step 42, the comparison reveals that the level of the analog signal VX is higher than or equal to the first full-scale value Vmax/4, it is this now the second intermediate means MI2 that the means of selection 31 will select in the step 45. Moreover, here again, this word selected MIS will be extended to 12 bits (step 46) by the means of extension 32.

More precisely, in this case, this extension corresponds to an addition of 2 least-significant bits b0 and b1 to the word MIS so as to form the extended word MIST over 12 bits which will be stored in the memory MMS.

Figure 5:
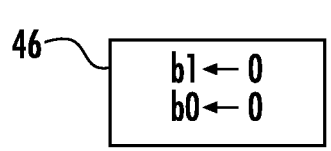
Figure 6:
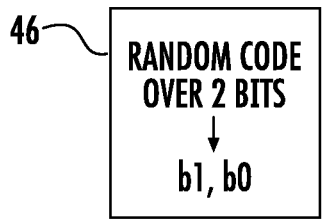

As illustrated in FIGS. 5 and 6, two variants are possible for completing the word MIS to 12 bits with the least-significant bits b0 and b1. According to a first variant illustrated in FIG. 5, the extension 46 is carried out by assigning a zero value to each of the bits b0 and b1. However, this particularly simple way of proceeding amounts to multiplying by 4 (in the present case m=10 and n=12) the selected word, in this case the second intermediate word MI2. Multiples of 4 are therefore obtained which can lead to missing digital values of the word MIST (histograms with holes) corresponding to the appearance of visual artefacts in the image which may be acceptable depending on the application targeted.

It is also possible, as illustrated in FIG. 6, to implement the extension 46 of the selected word by replacing the zero values of the bits b0 and b1 with a random code over 2 bits which corresponds to the addition of a random digital noise and allows the appearance of missing digital values during the analog/digital conversion to be avoided. It should be noted here that this digital noise may be either positive or negative, and that the replacement of the bits b0 and b1 by the random code may affect bits of higher order (e.g. $3^{rd}$).

Furthermore, this added digital noise remains negligible relative to the photonic noise (or 'shot noise'). Indeed, the shot noise is proportional to the square root of the number of electrons captured. When the illumination increases, the shot noise rapidly becomes dominant with respect to the read noise and with respect to the value of the least-significant bits. Also, the two added bits b0 and b1 are not really necessary because they are only there for quantifying the random noise. The post-processing module 3 may also comprise independent conventional means of offset correction for each converter and means of calibration.

Figure 7:
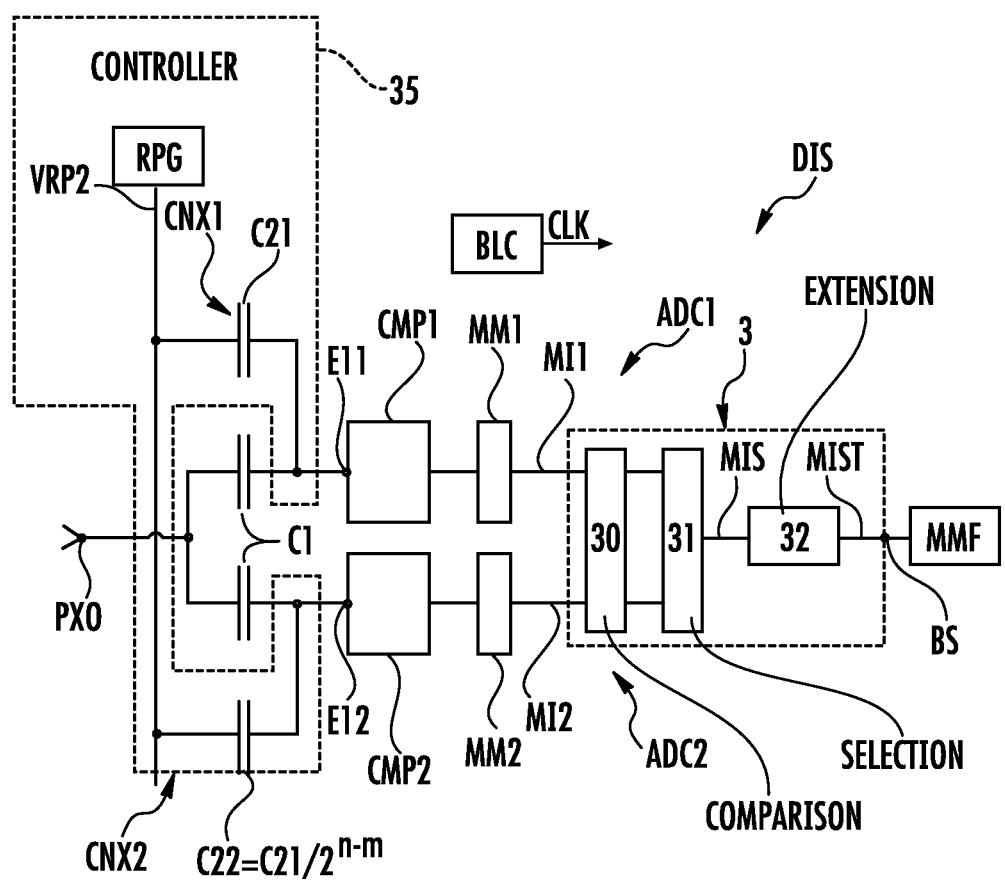

FIG. 7 illustrates another embodiment of the device DIS. In this embodiment, the device DIS only comprises one ramp generator RPG delivering a single voltage ramp VRP. This is more advantageous in terms of volume occupied with respect to the devices in FIG. 3. Indeed, in order not to have long propagation time constants, the metal tracks carrying the voltage ramp or ramps must be sufficiently wide in order to have a low resistance.

Using a single voltage ramp therefore allows the volume occupied by the device to be reduced and also avoids having disparities between two voltage ramps generated independently. The voltage ramp VRP is here again connected to the input E11 of the comparator stage CMP1 of the converter ADC1 by a first capacitive connection CNX1 having a capacitive value represented by the capacitor C21. This voltage ramp VRP is delivered to the input E12 of the comparator stage CMP2 of the converter ADC2 via a second capacitive connection CNX2 whose capacitive value is represented by a capacitor C22. The capacitive connections CNX1 and CNX2 along with the voltage ramp RPG define the controller 35 in this embodiment.

Furthermore, in such a manner as to conserve the full-scale ratio between the two analog/digital converters, the capacitive value of the capacitor C22 is this time $2^{n-m}$ times smaller than the capacitive value of the capacitor C21. The mode of operation of the device DIS in FIG. 7 is analogous to the mode of operation of the device DIS in FIG. 3. The capacitors C21 and C22 are here again metal-metal capacitors formed between metal branches.

Furthermore, in such a manner as to obtain a ratio 4 (in the case where n-m is equal to 2) between the capacitive values of the two capacitors C21 and C22, a metal branch is used to form the capacitor C21, whereas 4 metal branches to form the capacitor C22.

Figure 8:
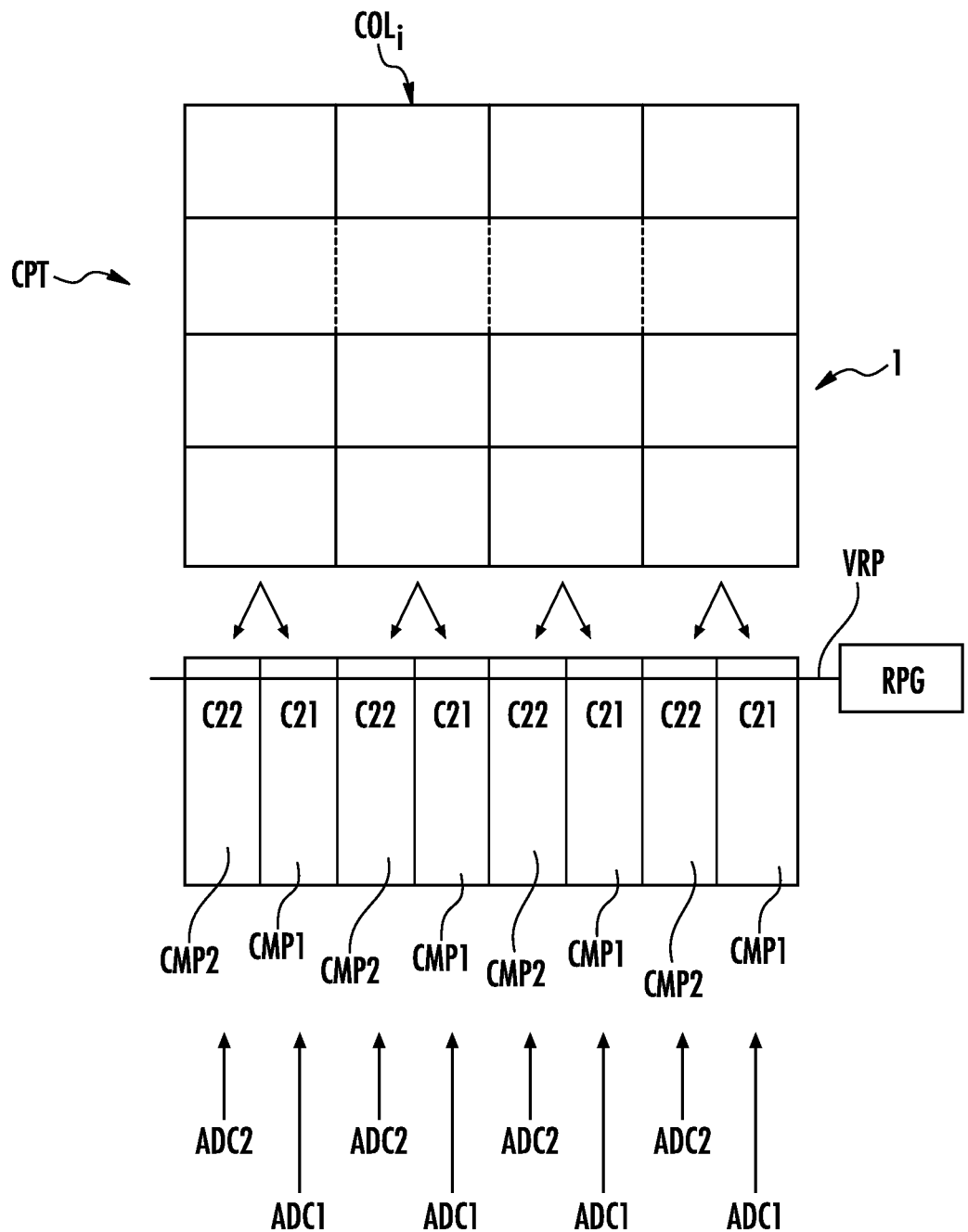

FIG. 8 illustrates schematically a first embodiment of an image sensor CPT incorporating one device DIS per column $COL_i$ of the matrix 1 of pixels. The embodiment in FIG. 8 is notably used for pixels with a typical width of 3.75 microns. Indeed, in this case, as illustrated in FIG. 8, the two converters ADC1 and ADC2, and plus particularly the two comparator stages of these converters, may be disposed side by side in the extension and within the width of the corresponding column $COL_i$. The metallization carrying the voltage ramp VRP will then run parallel to the rows of the matrix of pixels. The two converters placed side by side share the same power supplies, the same biasing and the same digital control signals.

Figure 9:
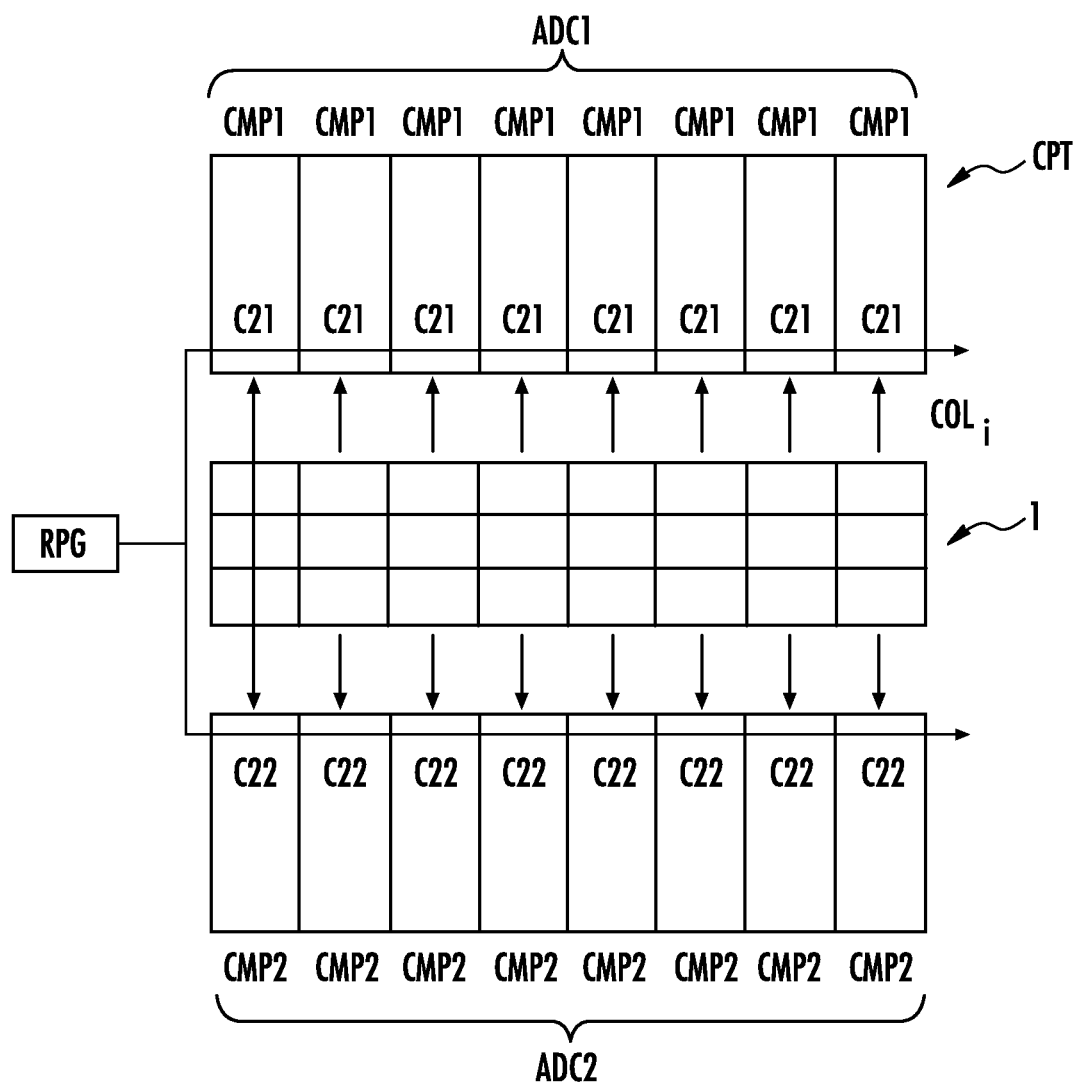

In the case where the pixels are smaller, the embodiment in FIG. 9 will then preferably be used. In this embodiment, the two converters ADC1 and ADC2, and plus particularly their comparator stage, are disposed in the extension and within the width of the corresponding column $COL_i$. However, this time, the first converter ADC1 is situated in the extension and within the width of the column at one end of the latter, whereas the second corresponding converter ADC2 is situated in the extension and within the width of the column but at its other end. The metallization carrying the voltage ramp VRP is then divided into two branches respectively running along the rows of the matrix of pixels at its two ends.

The invention claimed is:

1. A method for analog/digital conversion, the method comprising:
    performing a first analog/digital conversion of an analog signal over m bits, with m less than n, associated with a first full-scale value, to generate a first intermediate digital word of m bits;
    simultaneously performing a second analog/digital conversion of the analog signal over m bits associated with a second full-scale value higher than the first full-scale value by a gain ratio having a value equal or substantially equal to $2^{n-m}$, to generate a second intermediate digital word of m bits; and
    generating an n-bit digital word starting from at least one of the first and second intermediate digital words extended to n bits and from at least one threshold digital indication representative of at least one threshold lower than or equal to the first full-scale value.

2. The method according to claim 1, wherein the first analog/digital conversion is carried out in a first ramp-type converter and comprises generating a first voltage ramp delivered to an input of the first ramp-type converter by a first capacitive connection.

3. The method according to claim 2, wherein the second analog/digital conversion is carried out in a second ramp-type converter and comprises generating a second voltage ramp delivered to an input of the second ramp-type converter by a second capacitive connection.

4. The method according to claim 3, wherein the first voltage ramp has a slope lower than a slope of the second voltage ramp by the gain ratio, and capacitive values of the first and second capacitive connections are identical or substantially identical.

5. The method according to claim 4, wherein a capacitive value of the second capacitive connection is lower than a capacitive value of the first capacitive connection by the gain ratio.

6. The method according to claim 1, wherein the analog signal is representative of an illumination sensed by a photodiode.

7. A method for analog/digital conversion, the method comprising:
performing a first analog/digital conversion of an analog signal over m bits, with m less than n, associated with a first full-scale value, to generate a first intermediate digital word of m bits;
performing a second analog/digital conversion of the analog signal over m bits associated with a second full-scale value higher than the first full-scale value to generate a second intermediate digital word of m bits, the second full-scale value being higher than the first full-scale value by a gain ratio having a value equal or substantially equal to $2^{n-m}$; and
generating an n-bit digital word starting from at least one of the first and second intermediate digital words extended to n bits and from at least one threshold digital indication representative of at least one threshold lower than or equal to the first full-scale value.

8. The method according to claim 7, wherein the first and second analog/digital conversions are performed simultaneously.

9. An analog/digital conversion device comprising:
a signal input configured to receive an analog signal;
a first analog/digital converter having a first input coupled to the signal input and configured for carrying out a first analog/digital conversion of the analog signal over m bits, with m less than n, associated with a first full-scale value, and delivering a first intermediate m-bit digital word;
a second analog/digital converter having a second input coupled to the signal input and configured for carrying out a second analog/digital conversion of the analog signal over m bits associated with a second full-scale value higher than the first full-scale value by a gain ratio having a value equal or substantially equal to $2^{n-m}$, and delivering a second intermediate m-bit digital word;
a controller configured for making the first and second analog/digital converters operate simultaneously in such a manner that the two analog/digital conversions are carried out simultaneously; and
a post-processing module coupled to respective outputs of the two analog/digital converters and configured for carrying out a digital post-processing generating an n-bit digital word starting from at least one of the first and second intermediate digital m-bit words extended to n bits and from at least one threshold digital indication representative of at least one threshold lower than or equal to the first full-scale value.

10. The analog/digital conversion device according to claim 9, wherein the first and second analog/digital converters comprise ramp-type converters.

11. The analog/digital conversion device according to claim 10, wherein the controller comprises a first generator configured for generating a first voltage ramp and a second generator configured for generating a second voltage ramp.

12. The analog/digital conversion device according to claim 11, the first voltage ramp has a slope lower than a slope of the second voltage ramp by the gain ratio.

13. The analog/digital conversion device according to claim 12, further comprising:
a first capacitive connector connecting an output of the first generator to the first input of the first analog/digital converter; and
a second capacitive connector connecting an output of the second generator to the second input of the second analog/digital converter;
wherein capacitive values of the first and second capacitive connectors are identical or substantially identical.

14. The analog/digital conversion device according to claim 9, wherein the first and second analog/digital converters each comprises a ramp-type converter.

15. The analog/digital conversion device according to claim 9, wherein the controller comprises a generator configured to generate a voltage ramp and having an output.

16. The analog/digital conversion device according to claim 15 further comprising:
a first capacitive connector connecting the output of the generator to the first input of the first analog/digital converter; and
a second capacitive connector connecting the output of the generator to the second input of the second analog/digital converter;
wherein a capacitive value of the second capacitive connector is lower than a capacitive value of the first capacitor connector by the gain ratio.

17. An image sensor comprising:
at least one pixel configured to deliver an analog signal representative of an illumination sensed by the at least one pixel; and
a plurality of analog/digital conversion devices, each analog/digital conversion device comprising
a first analog/digital converter having a first input coupled to the at least one pixel and configured for carrying out a first analog/digital conversion of the analog signal over m bits, with m less than n, associated with a first full-scale value, and delivering a first intermediate m-bit digital word,
a second analog/digital converter having a second input coupled to the signal input and configured for carrying out a second analog/digital conversion of the analog signal over m bits associated with a second full-scale value higher than the first by a gain ratio having a value equal or substantially equal to $2^{n-m}$, and delivering a second intermediate m-bit digital word,
a controller configured for making the first and second analog/digital converters operate simultaneously in such a manner that the two analog/digital conversions are carried out simultaneously, and
a post-processing module coupled to respective outputs of the two analog/digital converters and configured for carrying out a digital post-processing generating an n-bit digital word starting from at least one of the two intermediate digital words extended to n bits and from at least one threshold digital indication representative of at least one threshold lower than or equal to the first full-scale value.

18. The image sensor according to claim 17, wherein the at least one pixel comprises a matrix of pixels organized in rows and columns, each pixel having a width measured in a direction of the rows and defining a column width; and wherein per column, a respective analog/digital conversion device of the plurality of analog/digital conversion devices each has a respective signal input configured to receive a respective analog signal from a pixel selected from a respective column, wherein the respective analog/digital conversion device is outside of the matrix of pixels and at least in part in at least one extension and within a width of the respective column.

19. The image sensor according to claim 18, wherein first and second analog/digital converters of a respective analog/digital conversion device are at least in part placed side by side at an end of the respective column.

20. The image sensor according to claim 17, wherein first and second analog/digital converters of a respective analog/digital conversion device are at least in part respectively placed at two ends of the respective column.

\* \* \* \* \*